(12) United States Patent
Chen

(10) Patent No.: US 7,450,357 B2
(45) Date of Patent: Nov. 11, 2008

(54) ELECTROSTATIC DISCHARGE PROTECTION CIRCUIT AND SEMICONDUCTOR STRUCTURE FOR ELECTROSTATIC DISCHARGE

(75) Inventor: Shiao-Shien Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/908,988

(22) Filed: Jun. 3, 2005

(65) Prior Publication Data

US 2006/0274464 A1 Dec. 7, 2006

(51) Int. Cl.
*H02H 9/00* (2006.01)
*H02H 3/08* (2006.01)
*H02H 9/02* (2006.01)
*H02H 3/22* (2006.01)
*H02H 7/12* (2006.01)
*H02H 1/00* (2006.01)
*H02H 1/04* (2006.01)
*H02H 9/06* (2006.01)

(52) U.S. Cl. .................. 361/56; 361/93.1; 361/111; 361/118

(58) Field of Classification Search .................. 361/56, 361/93.1, 111, 118
See application file for complete search history.

(56) References Cited

U.S. PATENT DOCUMENTS

| 6,034,397 | A | * | 3/2000 | Voldman | 257/335 |
| 6,465,768 | B1 | | 10/2002 | Ker et al. | 250/214.1 |
| 6,628,159 | B2 | * | 9/2003 | Voldman | 327/534 |
| 6,747,501 | B2 | * | 6/2004 | Ker et al. | 327/310 |
| 2004/0212936 | A1 | * | 10/2004 | Salling et al. | 361/56 |
| 2005/0047036 | A1 | * | 3/2005 | Liu et al. | 361/56 |
| 2006/0050451 | A1 | * | 3/2006 | Jen-Chou | 361/56 |

OTHER PUBLICATIONS

Article titled "A Fail-Safe ESD Protection Circuit with 230 fF Linear Capacitance for High-Speed/High-Precision 0.18 μm CMOS I/O Application" jointly published by Lin et al. in 2002. (4 pages).
Article titled "Substrate Pump NMOS for ESD Protection Applications" jointly published by Duvvury et al. in 2002. (11 pages).

* cited by examiner

*Primary Examiner*—Michael J Sherry
*Assistant Examiner*—Dharti H Patel
(74) *Attorney, Agent, or Firm*—Jianq Chyun IP Office

(57) ABSTRACT

An electrostatic discharge (ESD) protection circuit including a detection circuit for detecting an ESD current and a bypass circuit for bypassing the ESD current is provided. The detection circuit and the bypass circuit are coupled between a first pad and a second pad. The bypass circuit comprises a transistor, a diode, and a resistor. The drain of the transistor is coupled to the first pad. The source of the transistor is coupled to the second pad and a cathode of the diode. The substrate terminal of the transistor is coupled to an anode of the diode and an output terminal of the detection circuit. The resistor is coupled between the substrate terminal and the second pad. The diode keeps the voltage of the substrate terminal sufficient for turning on the transistor.

18 Claims, 12 Drawing Sheets

ELECTROSTATIC DISCHARGE PROTECTION CIRCUIT AND SEMICONDUCTOR STRUCTURE FOR ELECTROSTATIC DISCHARGE

BACKGROUND OF THE INVENTION

1. Field of the Invention

The present invention relates to an electrostatic discharge (ESD) protection circuit, and more particularly to an ESD protection circuit, an ESD protection apparatus, and a semiconductor structure adapted for ESD protection.

2. Description of the Related Art

Lately, with the advance of semiconductor technology, the integration of semiconductor devices has been increased by shrinking the line width and increasing the number of deposited film layers. However, while dimensions of integrated circuits shrink, the tolerable currents for circuits are also reduced. As a result, the minimized integrated circuits are more vulnerable to electrostatic discharge (ESD). When ESD is received by circuit devices, a huge voltage or current flows through the circuit devices in a very short time, thereby may burn up or puncture the circuit devices in an instant.

In order to avoid ESD damage, ingeneral an ESD protection circuit is disposed between a high-voltage terminal (VDD) and a low-voltage terminal (VSS) of an integrated circuit to bypass and prevent an ESD current from flowing through the integrated circuit.

FIG. 1A is a schematic drawing showing a conventional ESD protection circuit. Referring to FIG. 1A, the ESD protection circuit 100a comprises a gate-grounded N-type metal-oxide-semiconductor (GGNMOS) transistor 108, which is coupled between two pads 104 and 106 of the integrated circuit 102. Wherein, the pad 104 is coupled to the voltage VDD, and the pad 106 is coupled to the voltage VSS. The drain of the NMOS transistor 108 is coupled to the pad 104, and its source, gate, and substrate terminal are coupled to the pad 106. Accordingly, when ESD voltage is received, the parasitic bipolar transistor 110 of the NMOS transistor 108 turns on the NMOS transistor 108 to bypass the ESD current, as shown in the dotted line 110 in FIG. 1.

FIG. 1B is a schematic drawing showing another conventional ESD protection circuit. Referring to FIG. 1B, the ESD protection circuit 100b is coupled between the two pads 104 and 106 of the integrated circuit 102. The ESD protection circuit 100b comprises the capacitor 112, the resistor 114, and the NMOS transistors 116 and 118. Wherein, the pad 104 is coupled to the voltage VDD, and the pad 106 is coupled to the voltage VSS. The capacitor 112 is coupled between the voltage VDD and the node N1. The resistor 114 is coupled between the voltage VSS and the node N1. The gate of the transistor 116 is coupled to the node N1, its drain is coupled to the voltage VDD, its substrate terminal is coupled to the voltage VSS, and its source is coupled to the substrate terminal of the transistor 118. The gate of the transistor 118 is grounded, its drain is coupled to the voltage VDD, and its source is coupled to the voltage VSS. The transistor 118 also comprises a parasitic bipolar transistor 120 as shown in the dotted line 120 in FIG. 1B.

Referring to FIG. 1B, the resistance-capacitance (RC) constant of the resistor 114 and the capacitor 112 is larger than the rising time of the ESD voltage. When ESD voltage is received, the voltage of the node N1 reaches the voltage VDD swiftly, and turns on the transistor 116. After the transistor 116 is turned on, the source voltage is substantially equal to the drain voltage VDD, so the parasitic bipolar transistor 120 of the transistor 118 turns on the transistor 118 to bypass the ESD current.

FIG. 5 is a schematic drawing showing relationships between currents and voltages of the conventional ESD protection circuit and the ESD protection circuit of the present invention. Referring to FIG. 5, the curve C1 represents the relationship between the currents and voltages of the ESD protection circuit shown in FIG. 1A. Some disadvantages are apparent. For example, when a small ESD voltage is received, no ESD current is bypassed until the ESD voltage reaches a high level. As a result, its turn-on efficiency is not rapid enough, therefore causing puncturing or burning of the ESD protection circuit. Also, the ESD protection circuit may not protect the internal devices of the integrated circuit. In addition, the curve C2 represents the relationship between the currents and voltages of the ESD protection circuit shown in FIG. 1B. Though the disadvantage in the circuit of FIG. 1A is improved, the bypassed ESD current is not sufficient while a small ESD voltage is received. Only after the ESD voltage reaches a high level will the bypassed ESD current slowly become high. Accordingly, the turn-on efficiency of the ESD protection circuit is still not instant. Therefore, a novel ESD protection circuit with high turn-on efficiency is desired.

SUMMARY OF THE INVENTION

Accordingly, the present invention is directed to an electrostatic discharge (ESD) protection circuit, wherein the bypass circuit thereof comprises a diode to keep the voltage of the substrate terminal of the transistor stable so as to constantly turning on the transistor for bypassing the current. The ESD protection circuit of the present invention has an excellent turn-on efficiency, and can effectively bypass the ESD current.

In addition, the present invention is directed to a semiconductor structure related to ESD protection. The semiconductor structure comprises a diode for keeping the voltage of the substrate terminal of the transistor stable so as to constantly turning on the transistor for bypassing the current. The ESD protection circuit of the present invention has good turn-on efficiency, and can effectively bypass the ESD current.

The present invention provides an ESD protection circuit adapted for bypassing an ESD current between a first pad and a second pad. In an embodiment, the ESD protection circuit comprises a detection circuit, and a bypass circuit. The detection circuit is coupled between the first pad and the second pad, and detects the ESD current. The bypass circuit comprises a first transistor for bypassing an ESD current, a diode and a first resistor. A drain of the first transistor is coupled to the first pad, a source of the first transistor is coupled to the second pad and a cathode of the diode, a substrate terminal of the first transistor is coupled to an anode of the diode and an output terminal of the detection circuit, the first resistor is coupled between the substrate terminal and the second pad, and the diode keeps the voltage of the substrate terminal sufficient for turning on the first transistor.

In an embodiment of the present invention, a gate of the first transistor is coupled to the substrate terminal of the first transistor, the second pad, or an electronic apparatus.

In an embodiment of the present invention, the diode comprises a gate coupled diode. A gate of the gate coupled diode is coupled to the detection circuit or the first pad. A gate of the first transistor is coupled to the substrate terminal, the second pad, the gate of the gate coupled diode, or an electronic apparatus.

In an embodiment of the present invention, the first transistor comprises a metal-oxide-semiconductor (MOS) transistor. In addition, the MOS transistor comprises an N-type MOS transistor.

In an embodiment of the present invention, the detection circuit comprises a capacitor, a second resistor, and a second transistor. The capacitor is coupled between the first pad and a first node. The second resistor is coupled between the second pad and the first node. A gate of the second transistor is coupled to the first node, a drain of the second transistor is coupled to the first pad, a substrate terminal of the second transistor is coupled to the second pad, and a source of the second transistor is coupled to the output terminal of the detection circuit. In another embodiment of the present invention, the diode comprises a gate coupled diode. A gate of the gate coupled diode is coupled to the first pad or the first node, and a gate of the first transistor is coupled to the substrate terminal, the second pad or the gate of the gate coupled diode.

In an embodiment of the present invention, the detection circuit comprises a second resistor, a capacitor, and a first inverter. The second resistor is coupled between the first pad and the second node. The capacitor is coupled between the second pad and the second node. An input terminal of the first inverter is coupled to the second node, and an output terminal of the first inverter is coupled to an output terminal of the detection circuit. In another embodiment of the present invention, the diode comprises a gate coupled diode. A gate of the gate coupled diode is coupled to the first pad, and a gate of the first transistor is coupled to the substrate terminal, the second pad or the gate of the gate coupled diode.

In an embodiment of the present invention, the detection circuit comprises a second resistor, a capacitor, a first inverter, and a second inverter. The second resistor is coupled between the first pad and the second node. The capacitor is coupled between the second pad and the second node. An input terminal of the first inverter is coupled to the second node, and an output terminal of the first inverter is coupled to an output terminal of the detection circuit. An input terminal of the second inverter is coupled to the second node, and an output terminal of the second inverter is coupled to the gate of the gate coupled diode.

In an embodiment of the present invention, the first pad is coupled to a voltage VDD, and the second pad is coupled to a voltage VSS. In some embodiments, the first pad is coupled to an input/output (I/O) terminal, and the second pad is coupled to a voltage VSS.

In an embodiment of the present invention, the ESD protection circuit is disposed in an ESD protection apparatus.

The present invention provides a semiconductor structure, which is adapted for bypassing an electrostatic discharge (ESD) current between a first pad and a second pad. The semiconductor structure comprises a substrate, a transistor, a diode, and a resistor. The transistor bypasses the ESD current. The transistor comprises a first gate area formed over a surface of the substrate, a source and a drain formed in the substrate on two sides of the gate, and a substrate terminal under the gate. The diode comprises a cathode area provided by the source of the transistor, an anode formed in the substrate, and a second gate area formed over the surface of the substrate and adjacent to the source of the transistor and the anode of the diode. The resistor is formed by a resistor of the substrate between a first area and the substrate terminal. Wherein, the drain of the transistor is coupled to the first pad, the source of the transistor is coupled to the second pad and the cathode of the diode, the substrate terminal is coupled to the anode of the diode, the resistor is coupled between the substrate terminal and the second pad, and the diode keeps a voltage of the substrate terminal sufficient for turning on the transistor.

In an embodiment of the present invention, the gate of the transistor is coupled to the substrate terminal of the transistor, the second pad, the second gate area of the diode, or an electronic apparatus. The second gate of the diode is coupled to the first pad or a detection apparatus.

In an embodiment of the present invention, the transistor comprises a MOS transistor. In another embodiment of the present invention, the MOS transistor comprises an N-type MOS transistor, which comprises a P-type substrate. The source and the drain of the transistor comprise an N-type doped area, the anode of the diode comprises a P-type doped area, and the first area comprises a P-type doped area. Additionally, in some embodiments of the present invention, the semiconductor structure further comprises an N-type well area in the substrate under an intersection area of the source and the first gate of the transistor.

In an embodiment of the present invention, the semiconductor structure further comprises a second area between the anode of the diode and the first area, and the second area comprises an N-type doped area. A first isolation structure is disposed between the anode of the diode and the second area, and a second isolation area is disposed between the second area and the first area.

In an embodiment of the present invention, the first and second isolation structures comprise a shallow trench isolation (STI) structure or a localized oxidation isolation (LOCOS) structure.

In an embodiment of the present invention, the semiconductor structure further comprises an N-type well in the substrate under the second area.

In an embodiment of the present invention, the first gate of the transistor and/or the second gate of the diode comprise full silicide structures.

In an embodiment of the present invention, the semiconductor structure further comprises a silicide block structure over a surface of the substrate at an intersection area between the first gate of the transistor and the source of the transistor, or between the first gate of the transistor and the drain of the transistor.

In an embodiment of the present invention, the semiconductor structure further comprises a suicide block structure over a surface of the substrate at an intersection area between the second gate of the diode and the source of the transistor, or between the second gate of the diode and the drain of the transistor.

The above and other features of the present invention will be better understood from the following detailed description of the embodiments of the invention that is provided in communication with the accompanying drawings.

DESCRIPTION OF SOME EMBODIMENTS

Figure 1A:
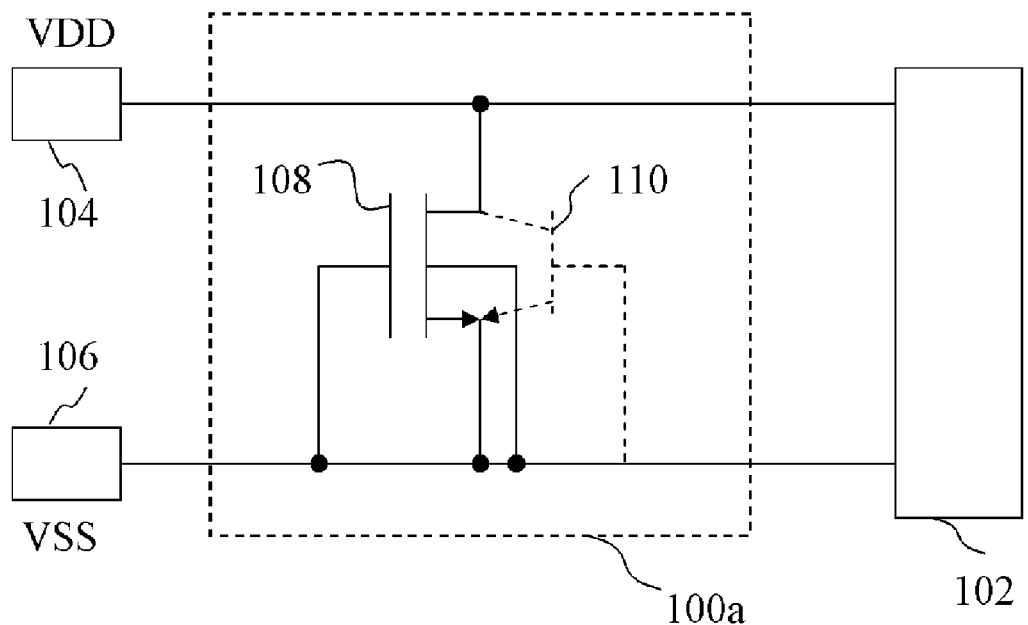
FIG. 1A is a schematic drawing showing a conventional ESD protection circuit.
Figure 1B:
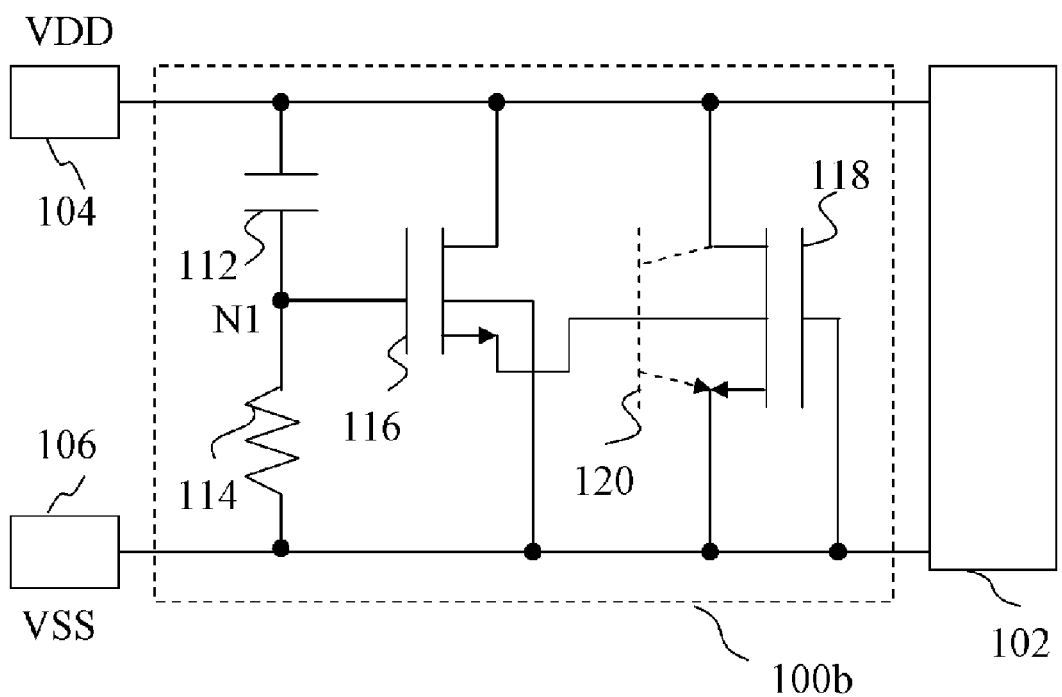
FIG. 1B is a schematic drawing showing another conventional ESD protection circuit.
Figure 2:
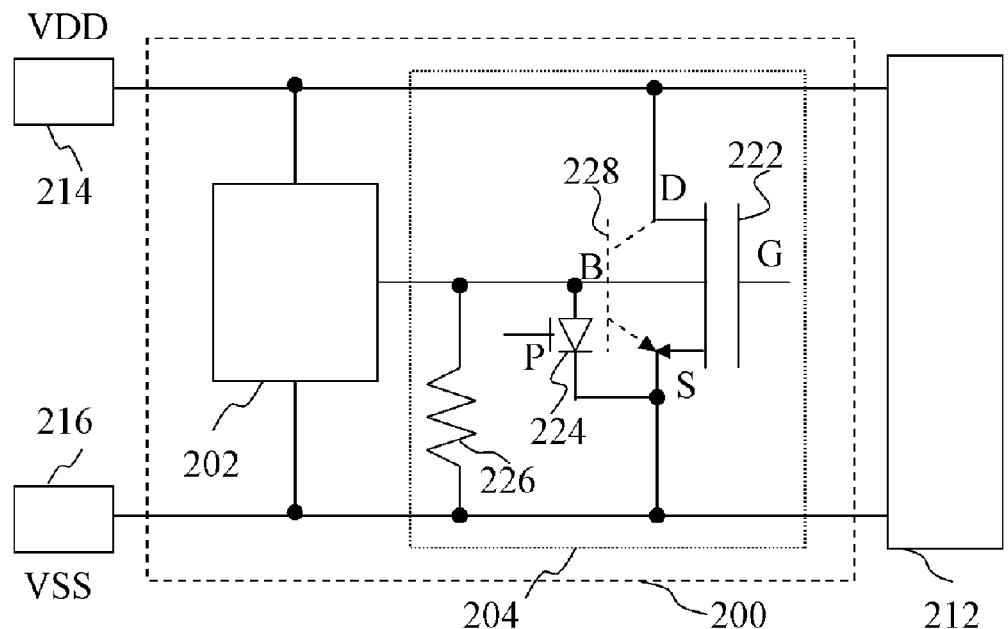
FIG. 2 is a schematic drawing showing an electrostatic discharge (ESD) protection circuit according to an embodiment of the present invention.

FIG. 2 is a schematic drawing showing an electrostatic discharge (ESD) protection circuit according to an embodiment of the present invention. Referring to FIG. 2, the ESD protection circuit 200 of the present invention comprises a detection circuit 202 and a bypass circuit 204, for example. The detection circuit 202 is coupled to the pads 214 and 216 of the integrated circuit 212 to detect whether there is an ESD current between the pads 214 and 216 or not. The bypass circuit 204 is coupled between the pads 214 and 216, and to the output terminal of the detection circuit 202 so as to bypass the ESD current. In an embodiment of the present invention, the pad 214 is coupled to the voltage VDD, and the pad 216 is coupled to the voltage VSS. Note that the integrated circuit 202, and the pads 214 and 216 are only embodiments of the present invention. The present invention, however, is not limited thereto. The present invention is applicable to any apparatus which requires an ESD protection circuit.

Referring to FIG. 2, in an embodiment of the present invention, the bypass circuit 204 comprises a transistor 222, a diode 224, and a resistor 226, for example. In an embodiment of the present invention, the transistor 222 comprises, for example, an N-type metal-oxide-semiconductor (NMOS) transistor. The drain D of the transistor 222 is coupled to the pad 214, its source S is coupled to the pad 216 and the cathode of the diode 224, and its substrate terminal B is coupled to the anode of the diode 224. In an embodiment of the present invention, the diode 224 comprises, for example, a gate coupled diode, which is coupled to a gate P. In an embodiment of the present invention, the transistor 222 comprises a parasitic bipolar transistor 228. The base of the parasitic bipolar transistor 228 is the substrate terminal B, its collector is the drain D of the transistor 222, and its emitter is the source S of the transistor 222, for example. The resistor 226 is coupled between the substrate terminal B and the pad 216, for example.

Following are the embodiments of the connection method of the transistor 222 of the present invention, and the operation of the detection circuit 202.

Figure 3A:
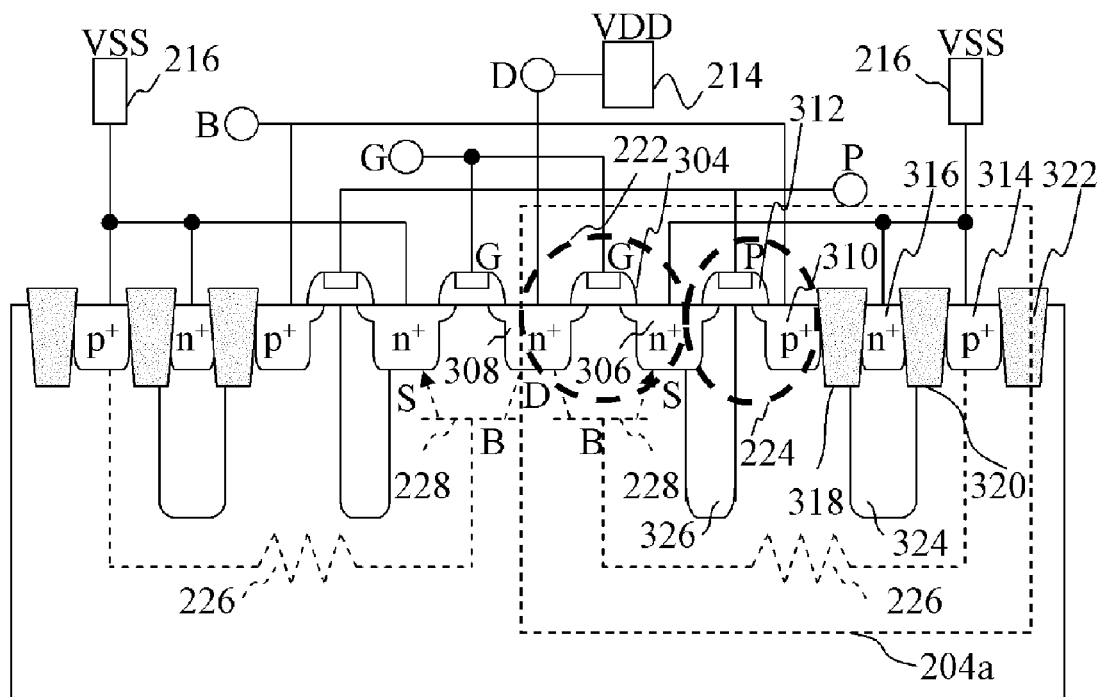
FIGS. 3A and 3B are schematic drawings showing the semiconductor structure of an ESD protection circuit according to an embodiment of the present invention.
Figure 3B:
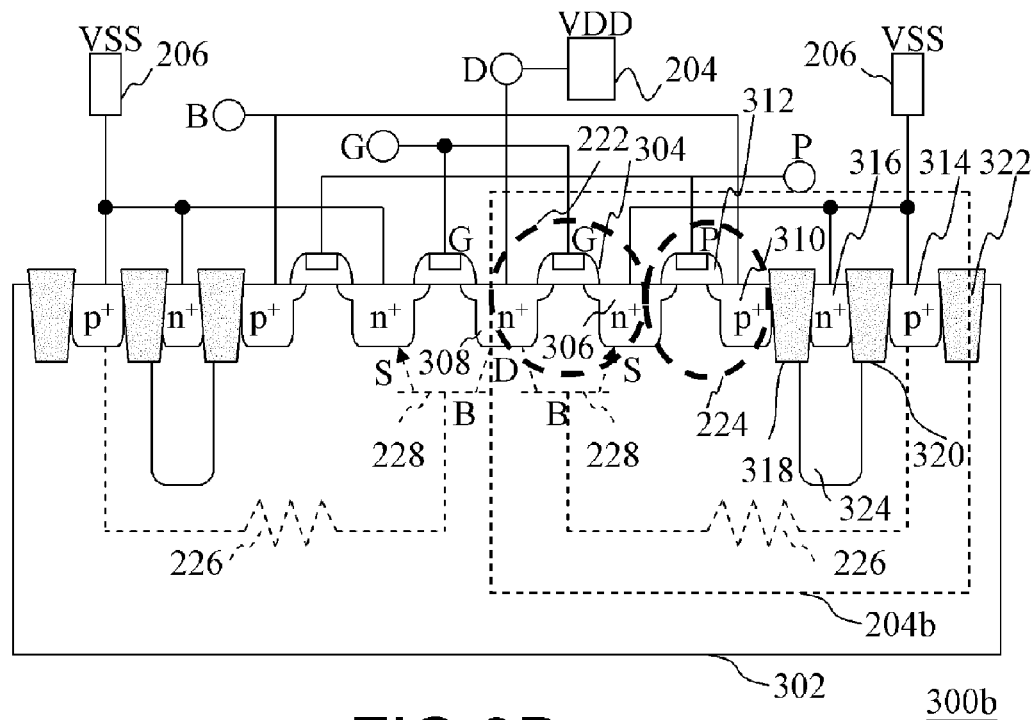

FIGS. 3A and 3B are schematic drawings showing the semiconductor structure of an ESD protection circuit according to the embodiments of the present invention. Referring to FIGS. 3A and 2, the semiconductor structure 300a comprises a substrate 302, for example. In an embodiment of the present invention, the substrate 302 comprises, for example, a P-type substrate. The substrate 302 comprises the bypass circuit 204a, which comprises the transistor 222, the diode 224, and the resistor 226. The transistor 222 comprises a gate 304 (gate G), an area 306 (source S) and an area 308 (drain D). If the transistor 222 comprises an NMOS transistor, the areas 306 and 308 comprise, for example, N-type doped regions (n+regions) 306 and 308. The diode 224 comprises, for example, areas 310 and 306. Wherein, the area 310 can comprise a P-type doped region (p+ region), serving as the anode of the diode 224. The area 306 can comprise, for example, an N-type doped region 306, serving as the cathode of the diode 224. If the diode 224 comprises a gate coupled diode, it is coupled to the gate 312 (gate P).

In an embodiment of the present invention, the area 308 (drain D) is the collector of the parasitic bipolar transistor 228 of the transistor 222, the area 306 (source S) is the emitter of the parasitic bipolar transistor 228 of the transistor 222, and the substrate terminal B between the areas 306 and 308 is the base of the parasitic bipolar transistor 228 of the transistor 222. In addition, a P-type doped region 314 is formed over the substrate 302, wherein the resistor of the substrate between the substrate terminal B and the area 314 is the resistor 226.

In another embodiment of the present invention, an N-type doped region 316 is optionally formed between the P-type doped regions 310 and 314. In addition, an isolation structure 318 can be formed, for example, between the areas 310 and 316, and another isolation structure 320 can be formed, for example, between the areas 314 and 316. In addition, an isolation structure 322 can be formed on the other side of the area 314, for example. In an embodiment of the present invention, the isolation structures 318, 320 and 322 can comprise, for example, shallow trench isolation (STI) structures, or localized oxidation isolation (LOCOS) structures. In addition, an N-well area 324 may further be formed in the substrate under the N-type doped region 316.

Referring to FIG. 3A, in an embodiment of the present invention, the gate 304 and/or the gate 312 can comprise, for example, a full silicide structure. In addition, a silicide block structure (not shown) can be optionally formed, for example, over the surface of the substrate in the intersection of the gate 304 and the area 306 and/or the intersection of the gate 304 and the area 308. In addition, a silicide block structure (not shown) can be optionally formed, for example, over the surface of the substrate in the intersection of the gate 312 and the area 306 and/or the intersection of the gate 312 and the area 310.

The difference between FIGS. 3A and 3B is that an N-well area 326 is formed in the substrate under the intersection area of the area 306 and the gate 314 in FIG. 3A. The bypass circuit 204b of the semiconductor structure 300b in FIG. 3B, however, does not comprise this area.

Referring to FIGS. 2 and 3A or 3B, in an embodiment of the present invention, the area 308 (drain D) is coupled to the pad 214. The areas 306, 314 and 316 are coupled to the pad 216. The area 310 is coupled to the substrate terminal B.

Note that there are two bypass circuits 204a or 204b in FIG. 3A or 3B. The transistor 222 of the bypass circuits 204a and 204b share the same area 308 (drain D). The present invention, however, is not limited to the semiconductor structures shown in FIGS. 3A and 3B.

Figure 4A:
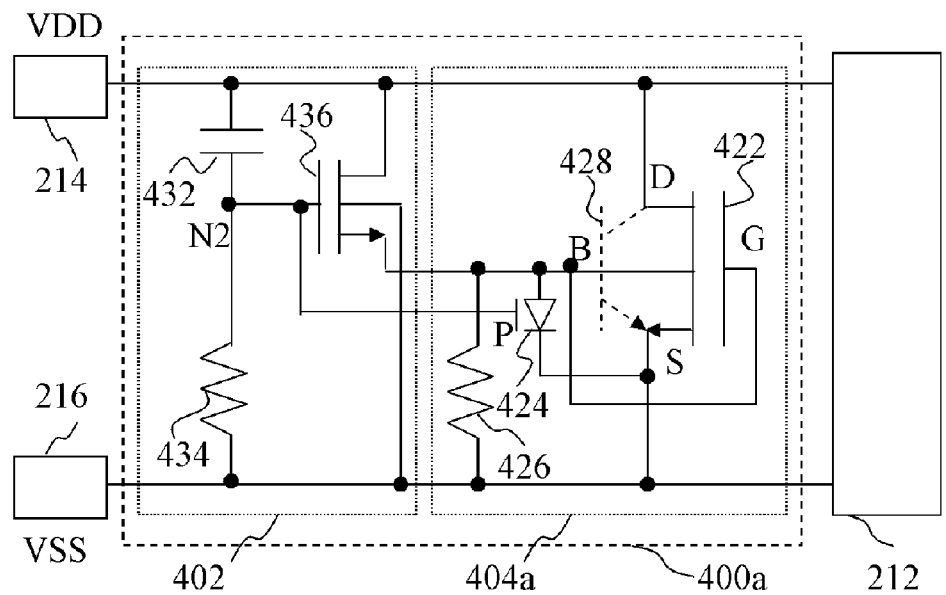
FIGS. 4A-4C are schematic drawings showing ESD protection circuits according to the embodiments of the present invention.
Figure 4B:
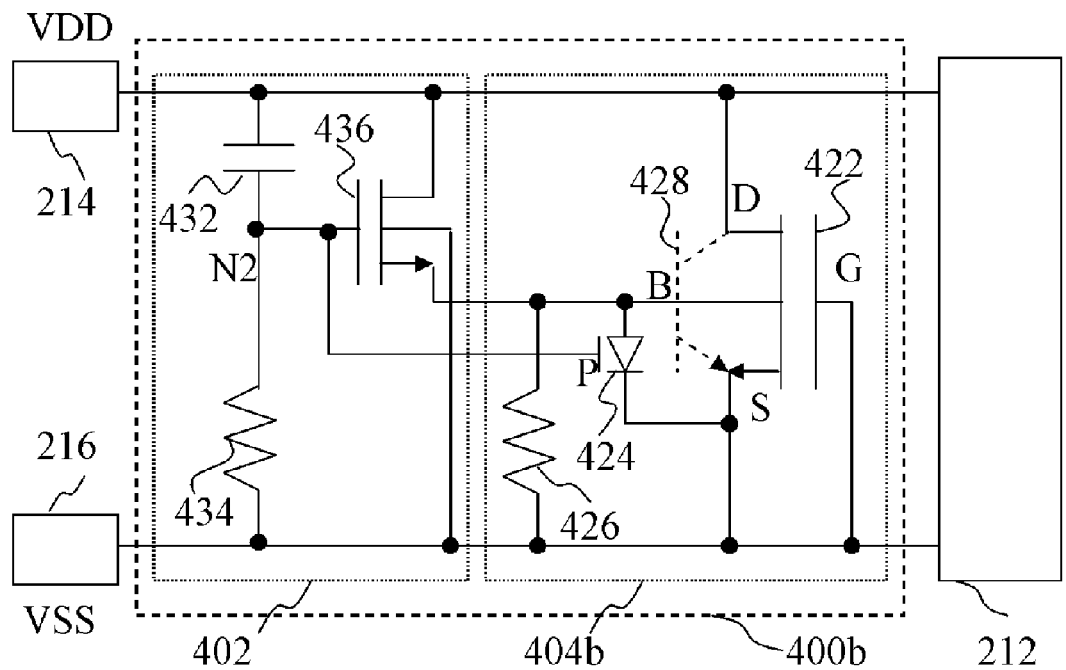
Figure 4C:
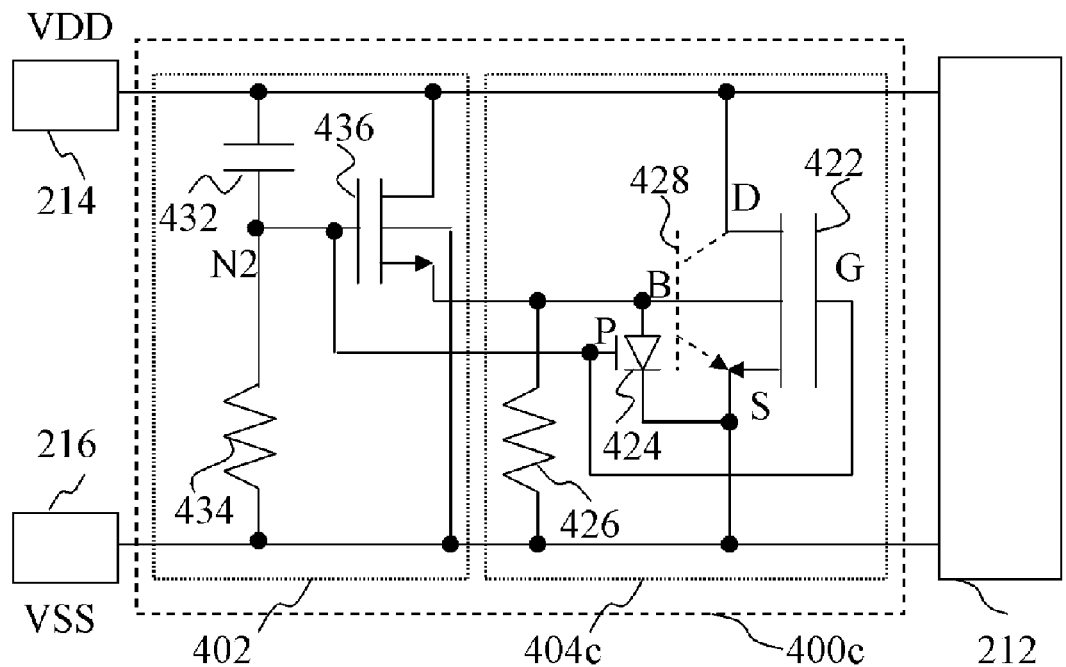

FIGS. 4A-4C are schematic drawings showing ESD protection circuits according to the embodiments of the present invention. Referring to FIGS. 4A/4B/4C, the ESD protection circuits 400a/400b/400c comprise, for example, the detection circuit 402 and the bypass circuits 404a/404b/404c, respectively. The detection circuit 402 is coupled between the pads 214 and 216 of the integrated circuit 212 to detect if an ESD current is received between the pads 214 and 216. The bypass circuits 404a/404b/404c are individually coupled between the pads 214 and 216, and to the output terminal of the detection circuit 402a to bypass the ESD current.

Referring to FIGS. 4A/4B/4C, in an embodiment of the present invention, each of the bypass circuits 404a/404b/404c comprises, for example, the transistor 422, the diode 424, and the resistor 426. The transistor 422 comprises a parasitic bipolar transistor 428. In an embodiment of the present invention, the connection structure of the transistor 422, the diode 424, the resistor 426, and the parasitic bipolar transistor 428 is as same as, or similar to, that of the transistor 222, the diode 224, the resistor 226, and the parasitic bipolar transistor 228 shown in FIG. 2. The difference is that the gate G of the transistor 422 is coupled to the substrate terminal B in FIG. 4A, the gate G of the transistor 422 is coupled to the pad 216 in FIG. 4B, and the gate G of the transistor 422 is coupled to the gate P in FIG. 4C.

Referring to FIGS. 4A/4B/4C, in an embodiment of the present invention, the detection circuit 202 comprises, for example, the capacitor 432, the resistor 434, and the transistor 436. The capacitor 432 is coupled between the pad 214 and the node N2. The resistor 434 is coupled between the pad 216 and the node N2. The gate of the transistor 436 is coupled to the node N2, its drain is coupled to the pad 214, its substrate terminal is coupled to the pad 216, and its source is coupled to the substrate terminal B of the transistor 422. In the embodiments of FIGS. 4A-4C, the node N2 can also be coupled to the gate P of the diode 424. In an embodiment of the present invention, the transistor 436 comprises, for example, a MOS transistor. The MOS transistor may comprise, for example, an NMOS transistor.

Referring to FIG. 4A, when ESD is received, the voltage of the node N2 reaches the voltage VDD instantly, and turns on the transistor 436. After the transistor 436 is turned on, the source voltage is substantially equal to the drain voltage VDD. Accordingly, the parasitic bipolar transistor 428 of the transistor 422 turns on the transistor 422 to bypass the ESD current. If the diode 424 does not exist, however, after the transistor 422 is turned on, most of the ESD current is bypassed through the transistor 422. As a result, the current flowing through the resistor 426 is reduced, causing the current flowing through the substrate terminal B to drop. The voltage of the substrate terminal B will decline, and cannot turn on the transistor 422. As a result, most of the ESD current cannot be bypassed. In the ESD protection circuit 400a of the present invention, the bypass circuit 404a comprises a diode 424, which can prevent the voltage drop of the substrate terminal B attributive to the reduced current flowing through the resistor 426, and keep turning on the transistor 422.

Figure 5:
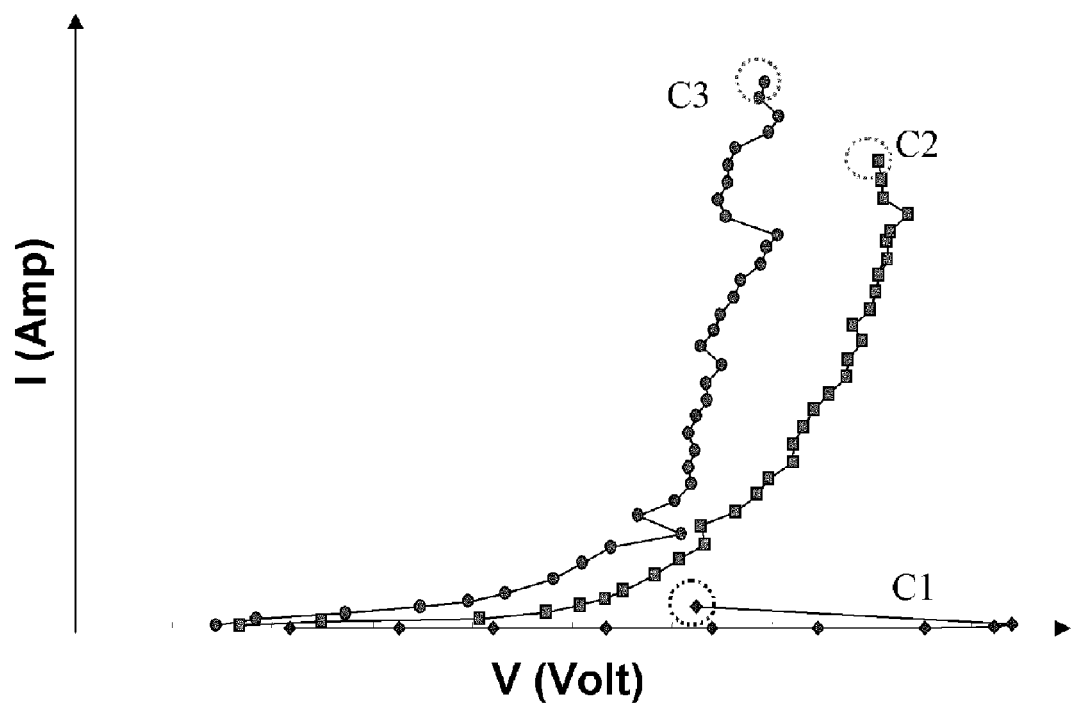
FIG. 5 is a schematic drawing showing a relationship between ESD currents and voltages according to a conventional ESD protection circuit and an ESD protection circuit of the present invention.

FIG. 5 is a schematic drawing showing a relationship between ESD currents and voltages according to a conventional ESD protection circuit and an ESD protection circuit of the present invention. Referring to FIG. 5, the curve C3 represents the relationship between the currents and voltages of the ESD protection circuit 400a of the present invention shown in FIG. 4A. It is noted that the advantage of the present invention is, for example, when a small ESD voltage is received, some ESD current is bypassed, and when the ESD voltage is higher than a specific voltage, the bypassed ESD current rapidly increases. Accordingly, the ESD protection circuit of the present invention has excellent turn-on efficiency, and the ESD current can be efficiently bypassed. Moreover, the ESD protection circuit will not be punctured or burned up. In an embodiment of the present invention, the relationship of the currents and voltages of the ESD protection circuits 400b and 400c shown in FIGS. 4B and 4C are similar to that of the curve C3 in FIG. 5. Detailed descriptions are not repeated.

As described above, the diode 224 can comprise, for example, a gate coupled diode, which is coupled to a gate P. In an embodiment of the present invention, the relationship between the currents and voltages of the ESD protection circuit of the present invention, and the turn-on efficiency of the ESD protection circuit can be modified by adjusting the voltage applied to the gate P. For example, by adjusting the specific voltage described above and the turn-on efficiency of the ESD protection circuit, the objects described above can be achieved.

Figure 6A:
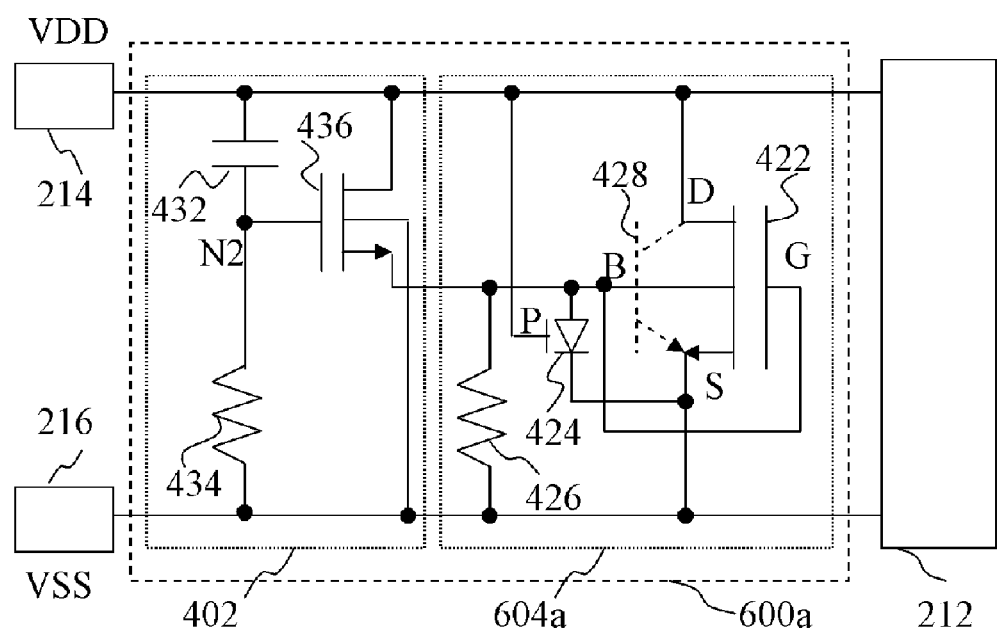
FIGS. 6A-6C are schematic drawings showing ESD protection circuits according to the embodiments of the present invention.
Figure 6B:
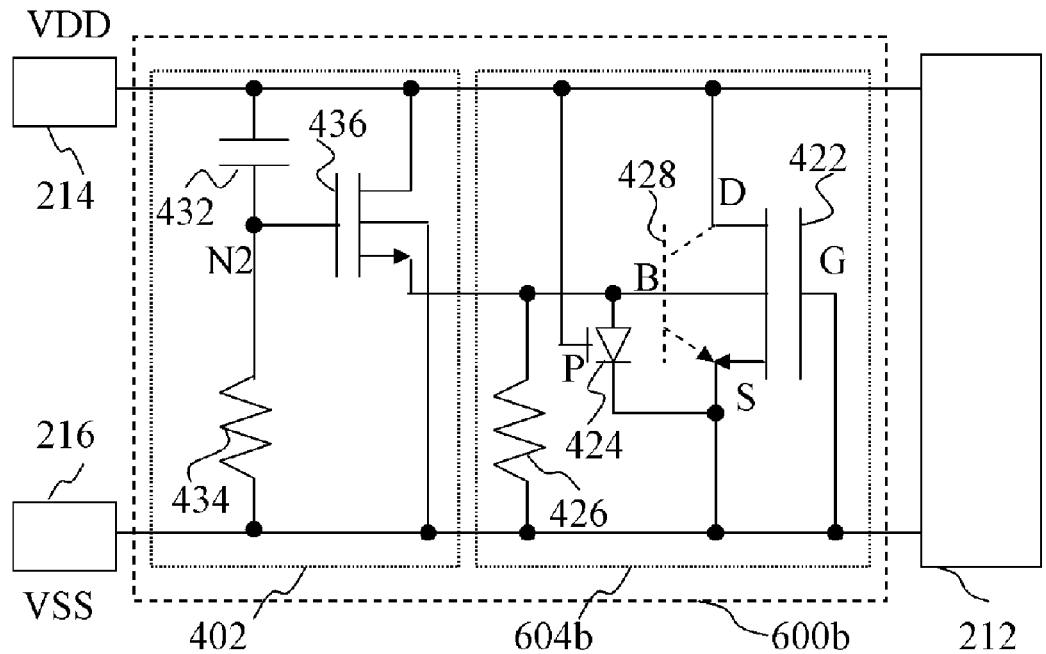
Figure 6C:
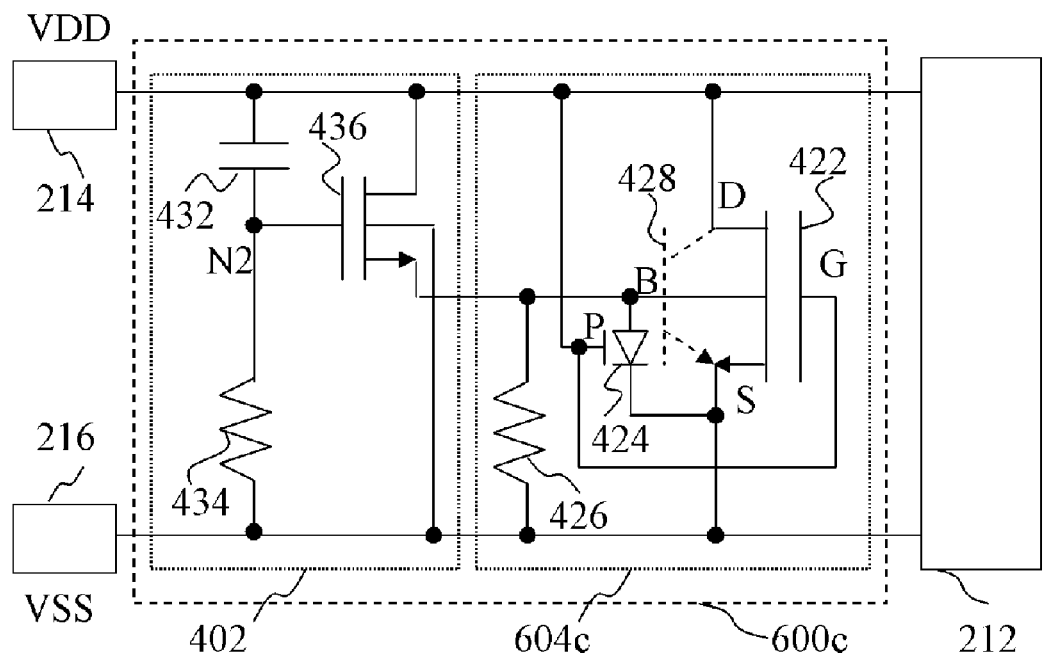

FIGS. 6A-6C are schematic drawings showing ESD protection circuits according to the embodiments of the present invention. Referring to FIGS. 6A/6B/6C, the ESD protection circuits 600a/600b/600c can comprise, for example, the detection circuit 402 and the bypass circuits 604a/604b/604c, respectively. It can be seen that the ESD protection circuits 600a/600b/600c in FIGS. 6A/6B/6C are similar to the ESD protection circuits 400a/400b/400c in FIGS. 4A/4B/4C, respectively. The difference is that the gate P of each of the ESD protection circuits 600a/600b/600c in FIGS. 6A/6B/6C is coupled to the pad 214, and the gate P of each of the ESD protection circuits 400a/400b/400c in FIGS. 4A/4B/4C is coupled to the node N2. In an embodiment of the present invention, the relationships between the currents and voltages of the ESD protection circuits 600a, 600b, and 600c in FIGS. 6A-6C are similar to that of curve C3 in FIG. 5. Detailed descriptions are not repeated.

Figure 7A:
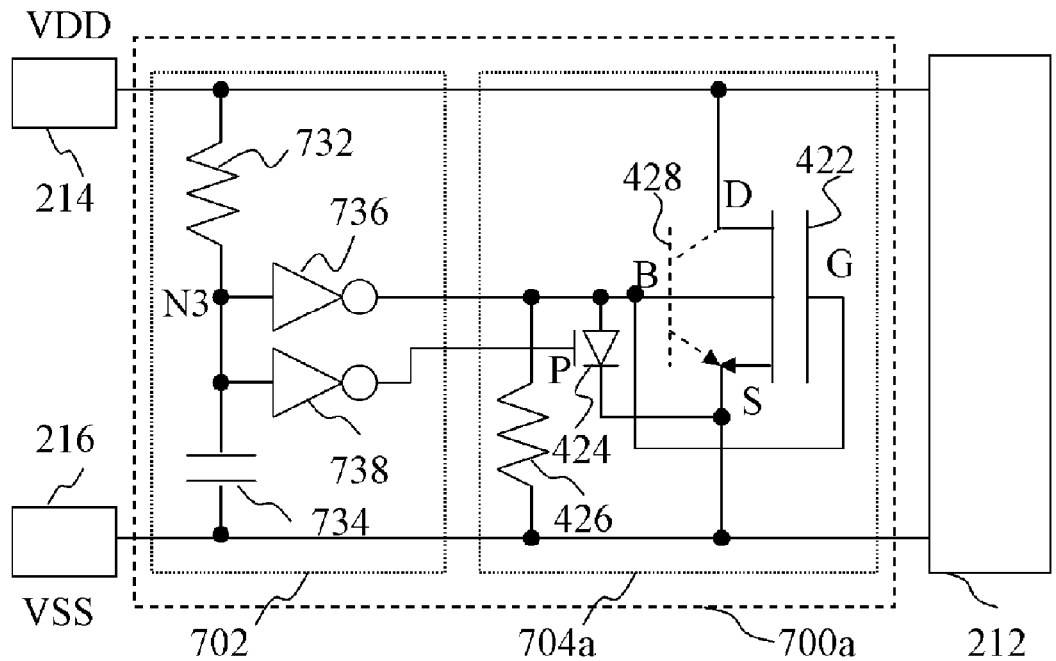
FIGS. 7A-7C are schematic drawings showing ESD protection circuits according to the embodiments of the present invention.
Figure 7B:
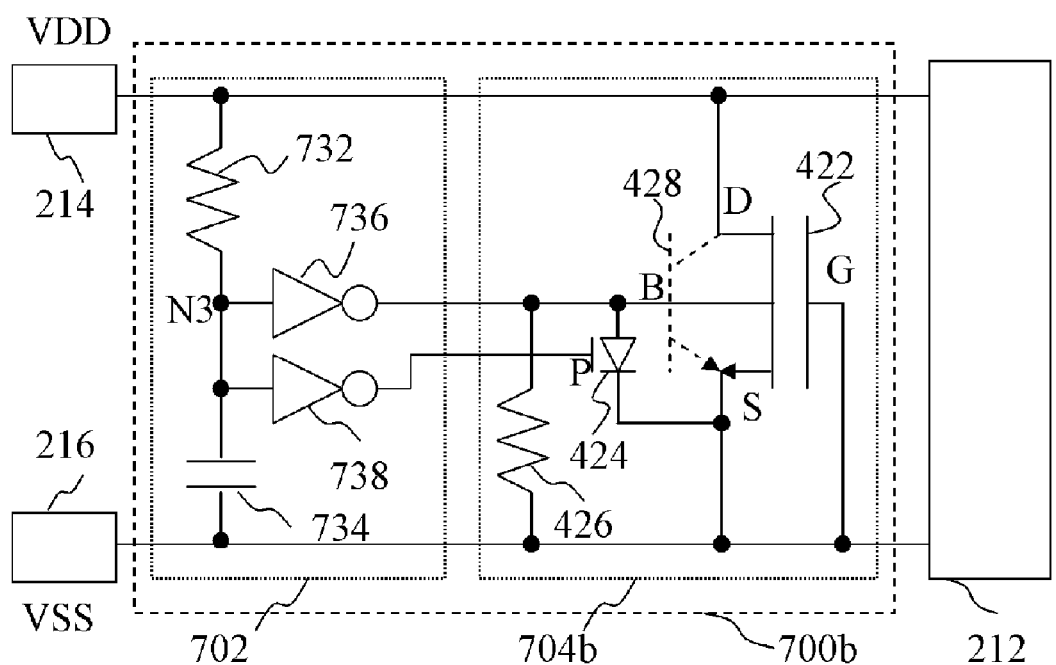
Figure 7C:
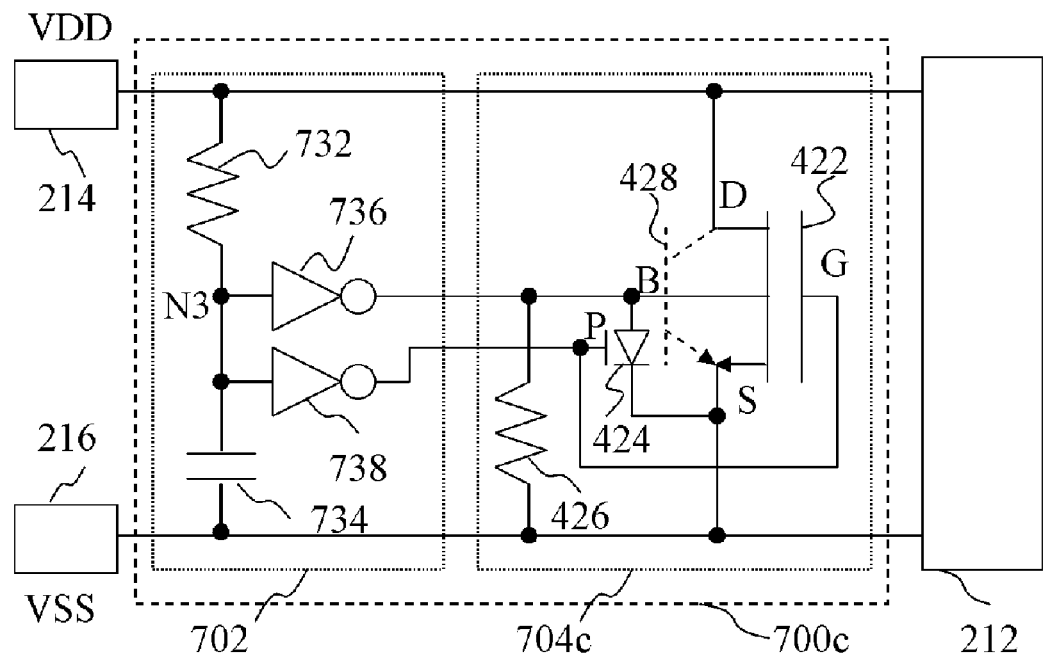

FIGS. 7A-7C are schematic drawings showing ESD protection circuits according to the embodiments of the present invention. Referring to FIGS. 7A/7B/7C, the ESD protection circuits 700a/700b/700c can comprise, for example, the detection circuit 702 and the bypass circuits 704a/704b/704c, respectively. In an embodiment of the present invention, the detection circuit 702 comprises, for example, the resistor 732, the capacitor 734, and inverters 736 and 738. The resistor 732 is coupled between the pad 214 and the node N3. The capacitor 734 is coupled between the pad 216 and the node N3. The input terminal of the inverter 736 is coupled to the node N3, and its output terminal is coupled to the substrate terminal B. The input terminal of the inverter 738 is coupled to the node N3, and its output terminal is coupled to the gate P. It can be seen that the ESD protection circuits 700a/700b/700c in FIGS. 7A/7B/7C are similar to the ESD protection circuits 400a/400b/400c in FIGS. 4A/4B/4C, respectively. The difference is that the gate P of each of the bypass circuits 704a/704b/704c of the ESD protection circuits 700a/700b/700c in FIGS. 7A/7B/7C is coupled to the output terminal of the inverter 738, and the substrate terminal B is coupled to the output terminal of the inverter 736. The gate P of each of the bypass circuits 404a/404b/404c of the ESD protection circuits 400a/400b/400c in FIGS. 4A/4B/4C is coupled to the node N2, and the substrate terminal B is coupled to the source of the transistor 436.

Referring to FIG. 7A, in an embodiment of the present invention, when the resistance-capacitance (RC) constant of the resistor 732 and the capacitor 734 far exceeds the rising time of the ESD voltage, as the ESD is received, the voltage of the node N3 starts with nearly 0 in a low-voltage level. After the voltage is inverted by the inverter 736, it turns into a high-voltage level, and the parasitic bipolar transistor 428 of the transistor 422 turns on the transistor 422 to bypass the ESD current. Similarly, the voltage of the node N3 inverted by the inverter 738 turns into a high-voltage level. Accordingly, the turn-on efficiency of the bypass circuits 404a, 404b, and 404c can be modified or enhanced.

Figure 8A:
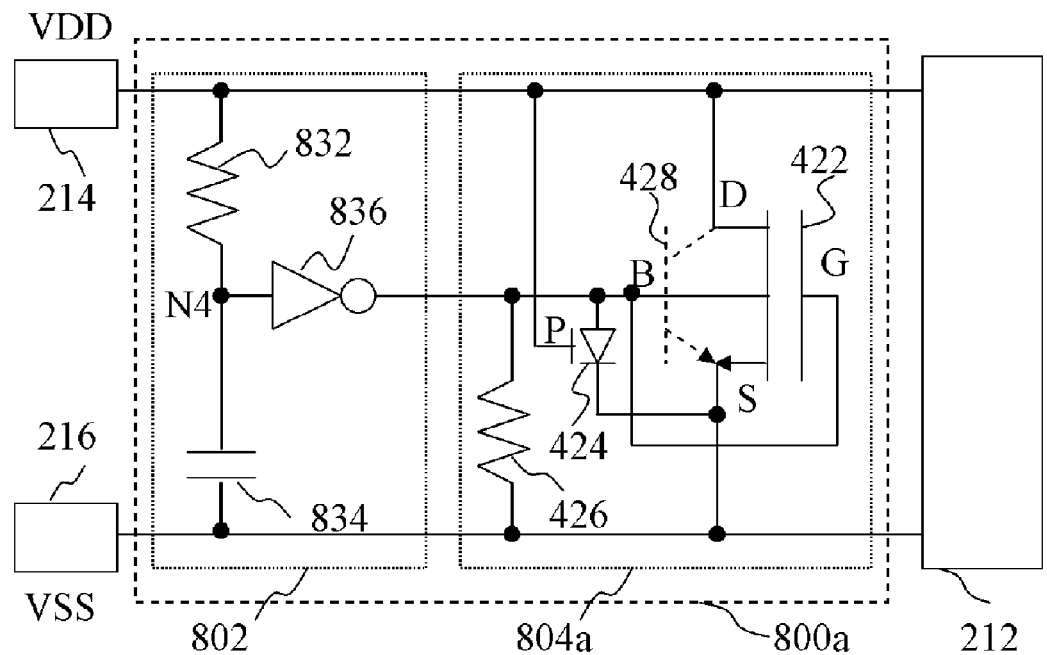
FIGS. 8A-8C are schematic drawings showing ESD protection circuits according to the embodiments of the present invention.
Figure 8B:
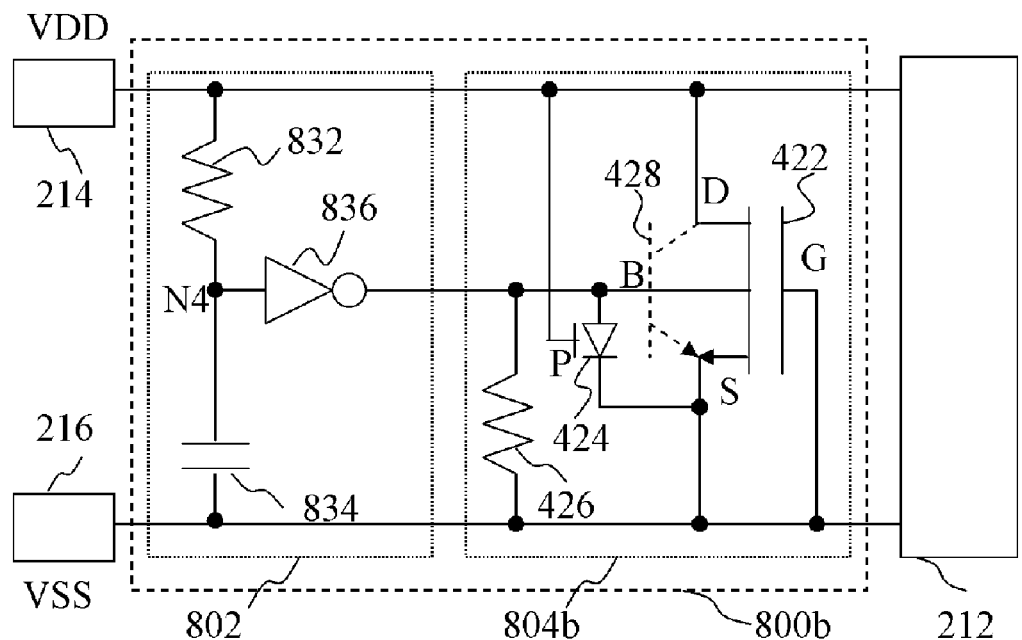
Figure 8C:
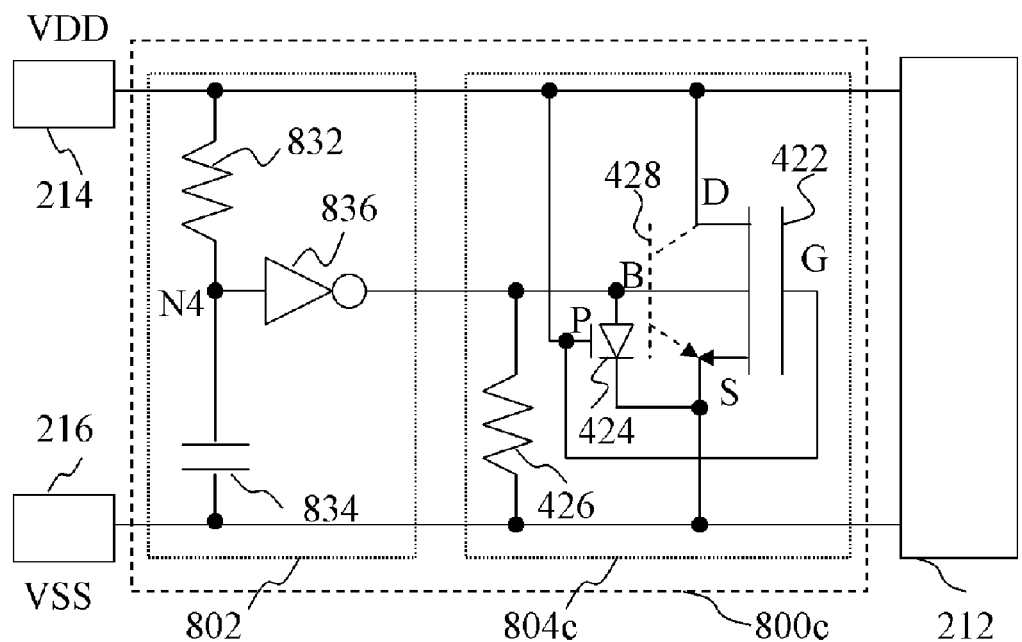

FIGS. 8A-8C are schematic drawings showing ESD protection circuits according to the embodiments of the present invention. Referring to FIGS. 8A/8B/8C, the ESD protection circuits 800a/800b/800c can comprise, for example, the detection circuit 802 and the bypass circuits 804a/804b/804c, respectively. In an embodiment of the present invention, the detection circuit 802 comprises, for example, the resistor 832, the capacitor 834, and the inverter 836. The resistor 832 is coupled between the pad 214 and the node N4. The capacitor 834 is coupled between the pad 216 and the node N4. The input terminal of the inverter 836 is coupled to the node N4, and its output terminal is coupled to the substrate terminal B. It can be found that the ESD protection circuits 800a/800b/800c in FIGS. 8A/8B/8C are similar to the ESD protection circuits 600a/600b/600c in FIGS. 6A/6B/6C, respectively. The difference is that the substrate terminal B of each of the bypass circuits 804a/804b/804c in FIGS. 8A/8B/8C, however, is coupled to the output terminal of the inverter 836. The substrate terminal B of each of the bypass circuits 604a/604b/604c in FIGS. 6A/6B/6C is coupled to the source of the transistor 436.

Referring to FIG. 8A, in an embodiment of the present invention, when the resistance-capacitance (RC) constant of the resistor 832 and the capacitor 834 far exceeds the rising time of the ESD voltage, as the ESD is applied, the voltage of the node N4 starts with nearly 0 in a low-voltage level. After the voltage is inverted by the inverter 836, it turns into a high-voltage level, and the parasitic bipolar transistor 428 of the transistor 422 turns on the transistor 422 to bypass the ESD current.

Figure 9:
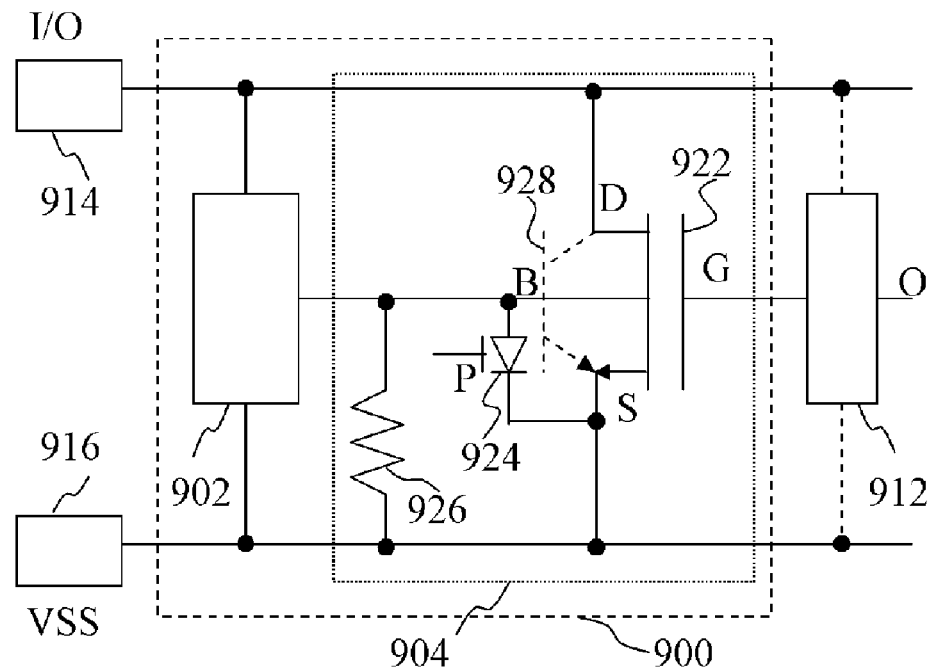
FIG. 9 is a schematic drawing showing an ESD protection circuit according to another embodiment of the present invention.

FIG. 9 is a schematic drawing showing an ESD protection circuit according to another embodiment of the present invention. Referring to FIG. 9, the ESD protection circuit 900 comprises, for example, the detection circuit 902, and the bypass circuit 904. The detection circuit 902 is coupled between the pads 914 and 916 to detect if an ESD current is received between the pads 914 and 916. The bypass circuit 904 is coupled between the pads 914 and 916, and to the output terminal of the detection circuit 902 to bypass the ESD current. In an embodiment of the present invention, the pad 914 can be coupled to the input/output (I/O) terminal, and the pad 916 is coupled to the voltage VSS. In another embodiment of the present invention, the ESD protection circuit 900 is further coupled to a pre-driver device 912. The pre-driver device 912 can be optionally coupled to the pads 914 and 916. The output terminal O of the pre-driver device 912 can be coupled to another electronic apparatus. Note that the pre-driver device 912, and pads 914 and 916 are devices of an embodiment of the present invention. The present invention, however, is not limited thereto. The present invention can be applicable to the any apparatus which requires an ESD protection circuit.

In an embodiment of the present invention, the bypass circuit 904 comprises, for example, the transistor 922, the diode 924, and the resistor 926. In an embodiment of the present invention, the transistor 922 can comprise, for example, an NMOS transistor. The drain D of the transistor 922 is coupled to the pad 914, its source S is coupled to the pad 916 and the cathode of the diode 924, its substrate terminal B is coupled to the anode of the diode 224, and its gate G is coupled to, for example, the pre-driver device 912. In an embodiment of the present invention, the diode 924 comprises, for example, a gate coupled diode, which is coupled to a gate P. In an embodiment of the present invention, the transistor 922 comprises the parasitic bipolar transistor 928.

The base of the parasitic bipolar transistor 928 is the substrate terminal B of the transistor 922, its collector is the drain D of the transistor 922, and its emitter is the source S of the transistor 922.

Figure 10A:
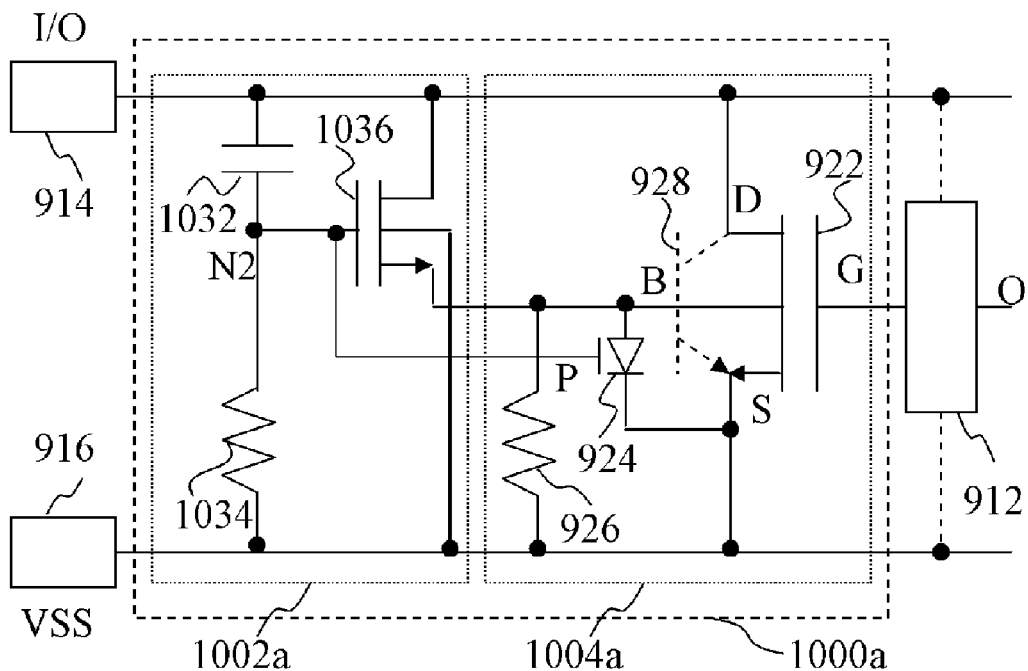
FIGS. 10A-10D are schematic drawings showing ESD protection circuits according to the embodiments of the present invention.
Figure 10B:
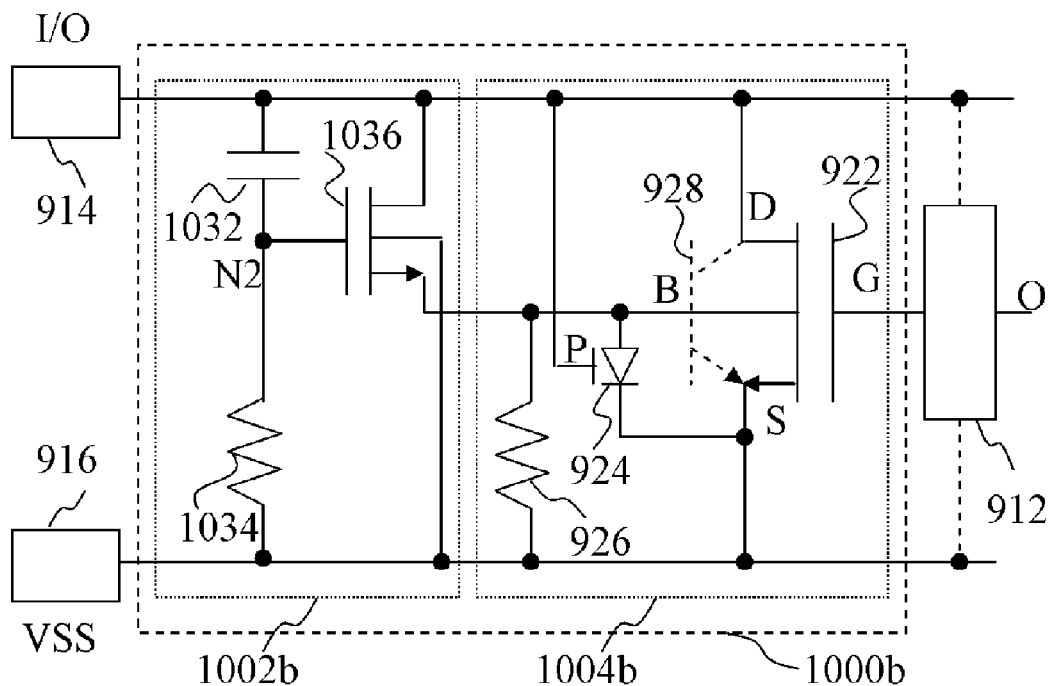
Figure 10C:
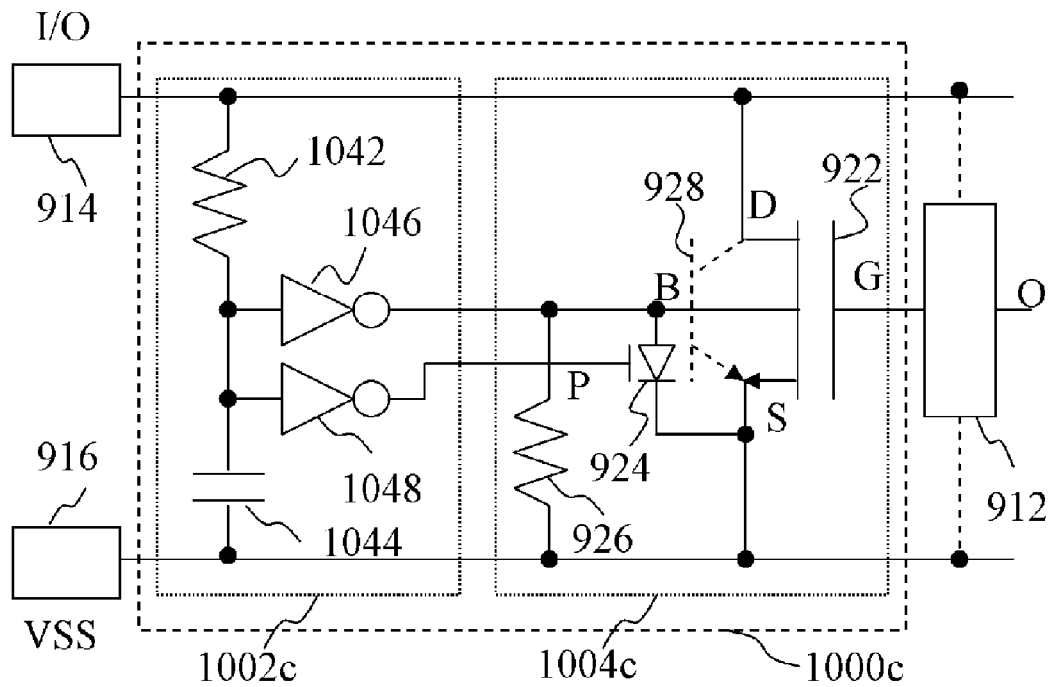
Figure 10D:
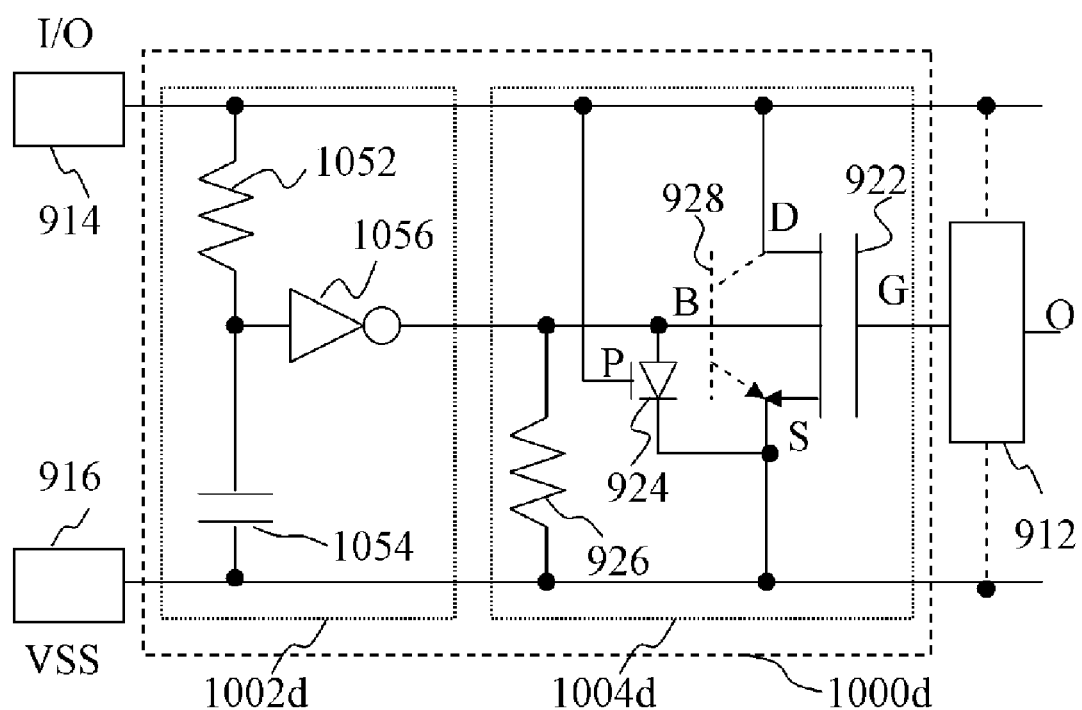

FIGS. 10A-10D are schematic drawings showing ESD protection circuits according to the embodiments of the present invention. Referring to FIGS. 10A/10B/10C/10D, the ESD protection circuits 1000a/1000b/1000c/1000d can comprise, for example, the detection circuits 1002a/1002b/1002c/1002d, and the bypass circuits 1004a/1004b/1004c/1004d, respectively. In an embodiment of the present invention, it can be found that the ESD protection circuits 1000a/1000b/1000c/1000d in FIGS. 10A/10B/10C/10D are similar to the ESD protection circuits 400a/600a/700a/800a in FIGS. 4A/6A/7A/8A, respectively. The difference is that the gate G of each of the bypass circuits 1004a/1004b/1004c/1004d in FIGS. 10A/10B/10C/10D is coupled to the output terminal of the pre-driver device 912. The gate G of each of the bypass circuits 404a/604a/704a/804a in FIGS. 4A/6A/7A/8A, however, is coupled to the substrate terminal B of the transistor 422.

Note that another embodiment of the present invention provides an ESD protection apparatus which comprises any one of ESD protection circuits according to the present invention.

Accordingly, the advantages of the present invention include the diode in the bypass circuit, which can be a gate coupled diode, so the voltage of the substrate terminal of the transistor for bypassing the ESD current can be kept stable for constantly turning on the transistor. Another advantage is when a small ESD voltage is received, some ESD current is bypassed. If the ESD voltage is higher than a specific level, the bypassed ESD current rapidly increases. Accordingly, the ESD protection circuit of the present invention has excellent turn-on efficiency, and the ESD current can be efficiently bypassed. Moreover, the ESD protection circuit will not be easily punctured or burned up.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An electrostatic discharge (ESD) protection circuit for bypassing an ESD current between a first pad and a second pad, the ESD protection circuit comprising:
   a detection circuit for detecting the ESD current, the detection circuit is coupled between the first pad and the second pad, comprising:
   a second resistor, coupled between the first pad and a second node;
   a capacitor, coupled between the second pad and the second node;
   a first inverter, wherein an input terminal of the first inverter is coupled to the second node, and an output terminal of the first inverter is coupled to an output terminal of the detection circuit; and
   a second inverter, wherein an input terminal of the second inverter is coupled to the second node, and an output terminal of the second inverter is coupled to a control gate of a gate coupled diode; and
   a bypass circuit, comprising:
   a first transistor for bypassing the ESD current;
   the gate-coupled diode, having the control gate; and
   a first resistor, wherein a drain of the first transistor is coupled to the first pad, a source of the first transistor is coupled to the second pad and a cathode of the gate-coupled diode, a substrate terminal of the first transistor is coupled to an anode of the gate-coupled diode and an output terminal of the detection circuit, the first resistor is coupled between the substrate terminal and the second pad to perform a parallel connection with the gate-coupled diode, and when receiving an ESD voltage applied to the ESD protection circuit, the gate-coupled diode keeps a voltage of the substrate terminal sufficient for turning on the first transistor, wherein the control gate of the gate-coupled diode regulates a bypassing capacity of the ESD current of the gate-coupled diode.

2. The ESD protection circuit of claim 1, wherein a gate of the first transistor is coupled to the substrate terminal, the second pad, the control gate of the gate-coupled diode, or an electronic apparatus.

3. The ESD protection circuit of claim 1, wherein the first transistor comprises a metal-oxide-semiconductor (MOS) transistor.

4. The ESD protection circuit of claim 3, wherein the MOS transistor comprises an N-type MOS transistor.

5. The ESD protection circuit of claim 1, wherein the first pad is coupled to a voltage VDD, and the second pad is coupled to a voltage VSS.

6. The ESD protection circuit of claim 1, wherein the first pad is coupled to an input/output terminal, and the second pad is coupled to a voltage VSS.

7. The ESD protection circuit of claim 1, wherein the ESD protection circuit is disposed in an ESD protection apparatus.

8. A semiconductor structure for bypassing an electrostatic discharge (ESD) current between a first pad and a second pad, the semiconductor structure comprising:

a substrate;

a transistor for bypassing the ESD current, the transistor comprising a first gate area formed over a surface of the substrate, a source and a drain formed in the substrate at two sides of the gate of the transistor, and a substrate terminal under the gate of the transistor;

a diode, wherein the source of the transistor is provided for a cathode of the diode, an anode of the diode is formed in the substrate, and a gate of the diode is formed over the surface of the substrate and adjacent to the source of the transistor and the anode of the diode; and a resistor, formed by a resistor of the substrate between a first area of the substrate and the substrate terminal;

wherein the drain of the transistor is coupled to the first pad, the source of the transistor is coupled to the second pad and the cathode of the diode, the substrate terminal is coupled to the anode of the diode, the resistor is coupled between the substrate terminal and the second pad, and the diode keeps a voltage of the substrate terminal sufficient for turning on the transistor.

9. The semiconductor structure of claim 8, wherein the gate of the transistor is coupled to the substrate terminal of the transistor, the second pad, the second gate area of the diode, or an electronic apparatus, and the second gate of the diode is coupled to the first pad or a detection apparatus.

10. The semiconductor structure of claim 8, wherein the transistor comprises a MOS transistor.

11. The semiconductor structure of claim 10, wherein the MOS transistor comprises an N-type MOS transistor, which comprises a P-type substrate, the source and the drain of the transistor comprise an N-type doped area, the anode of the diode comprises a P-type doped area, and the first area comprises a P-type doped area.

12. The semiconductor structure of claim 11, further comprising an N-type well area in the substrate under an intersection area of the source and the first gate of the transistor.

13. The semiconductor structure of claim 11, further comprising a second area between the anode of the diode and the first area, the second area comprising an N-type doped area, a first isolation stricture is disposed between the anode of the diode and the second area, and a second isolation area is disposed between the second area and the first area.

14. The semiconductor structure of claim 13, wherein the first and second isolation structures comprise a shallow trench isolation (STI) structure or a localized oxidation isolation (LOCOS) structure.

15. The semiconductor structure of claim 13, further comprising an N-type well in the substrate under the second area.

16. The semiconductor structure of claim 11, wherein the first gate of the transistor and/or the second gate of the diode comprise a full silicide structure.

17. The semiconductor structure of claim 11, further comprising a silicide block structure over a surface of the substrate at an intersection area between the first gate of the transistor and the source of the transistor, or between the gate of the transistor and the drain of the transistor.

18. The semiconductor structure of claim 11, further comprising a silicide block structure over a surface of the substrate at an intersection area between the second gate of the diode and the source of the transistor, or between the gate of the diode and the drain of the transistor.

* * * * *